United States Patent [19]
Hernandez et al.

[11] Patent Number: 5,422,782
[45] Date of Patent: Jun. 6, 1995

[54] MULTIPLE RESONANT FREQUENCY DECOUPLING CAPACITOR

[75] Inventors: Jorge M. Hernandez, Mesa; Daniel Douriet, Chandler, both of Ariz.

[73] Assignee: Circuit Components Inc., Tempe, Ariz.

[21] Appl. No.: 981,113

[22] Filed: Nov. 24, 1992

[51] Int. Cl.⁶ .................. H01G 4/228; H01G 4/38
[52] U.S. Cl. ..................... 361/306.2; 361/321.2; 361/328; 361/329
[58] Field of Search .............. 361/301.4, 303, 304, 361/305, 306.1, 306.2, 306.3, 307, 308.1, 310, 311, 312, 313, 328, 329, 330, 734; 333/181, 184, 185

[56] References Cited

U.S. PATENT DOCUMENTS

| | | | |
|---|---|---|---|
| 3,617,830 | 11/1971 | Perna | 361/329 |
| 4,475,143 | 10/1984 | Hernandez | 361/306.2 |
| 4,502,101 | 2/1985 | Jodoin | 361/306.2 |
| 4,584,627 | 4/1986 | Schilling et al. | 361/306.2 |
| 4,626,958 | 12/1986 | Lockard et al. | 361/306.2 |
| 4,658,327 | 4/1987 | Hernandez | 361/306.2 |
| 4,667,267 | 5/1987 | Hernandez et al. | 361/306.2 |
| 4,734,818 | 3/1988 | Hernandez et al. | 361/306.2 |
| 4,734,819 | 3/1988 | Hernandez et al. | 361/306.2 |
| 4,748,537 | 5/1988 | Hernandez et al. | 361/306.2 |
| 4,751,613 | 6/1988 | Werdin et al. | 361/816 |
| 4,853,826 | 8/1989 | Hernandez | 361/306.2 |
| 4,989,117 | 1/1991 | Hernandez | 361/306.2 |
| 4,994,936 | 2/1991 | Hernandez | 361/306.2 |
| 5,027,089 | 6/1991 | Henke | 333/181 |

FOREIGN PATENT DOCUMENTS 2152753  8/1985  United Kingdom ............ 361/306.2

Primary Examiner—Bruce A. Reynolds
Assistant Examiner—Gregory L. Mills
Attorney, Agent, or Firm—Fishman, Dionne & Cantor

[57] ABSTRACT

A multiple resonant frequency decoupling capacitor is presented. The decoupling capacitor comprises a plurality of capacitive elements, each having a different resonant frequency to define a frequency bandwidth for noise supression. One of the capacitive elements having a resonant frequency indicative of the clock frequency of an integrated circuit being decoupled by the capacitor. Further, at least one other capacitive element having a resonant frequecny indicative of a harmonic frequency of the clock frequency.

14 Claims, 5 Drawing Sheets

MULTIPLE RESONANT FREQUENCY DECOUPLING CAPACITOR

BACKGROUND OF THE INVENTION

This invention relates to the field of decoupling capacitors for integrated circuits. More particularly, this invention relates to a multiple resonant frequency decoupling capacitor which has an increased bandwidth.

It is well known in the field of micro-electronics that high frequency operation, particularly the switching of integrated circuits, can result in transient energy being coupled into the power supply circuit. Generally, the prevention of coupling of undesired high frequency noise or interference into the power supply for the integrated circuit is accomplished by connecting a decoupling capacitor between the power and ground leads of the integrated circuit (IC).

One connection scheme which has been found to be quite successful is to mount a decoupling capacitor under the integrated circuit. Such decoupling capacitors are commonly available from Rogers Corporation, (assignee of the present application) and sold under the trademark MICRO Q. Examples of these decoupling capacitors are found in U.S. Pat. Nos. 4,475,143; 4,502,101 and 4,748,537 all of which are assigned to the assignee hereof.

U.S. Pat. Nos. 4,626,958; 4,667,267; 4,658,327; 4,734,818; 4,734,819 and 4,853,826 are also assigned to the assignee hereof and incorporated herein by reference. These patents disclose decoupling capacitors which are particularly well suited for pin grid array and plastic lead chip carrier packages. For example, the PGA decoupling capacitor of U.S. Pat. No. 4,853,826 comprises a dielectric material sandwiched between a pair of conductors. A plurality of flat plates or skirts are provided along a periphery of each conductor. These skirts extend outwardly a short distance generally in the plane of the metal conductors to which they are attached and are then bent downwardly so as to extend in the direction which is perpendicular to the planes of the conductors. The entire assembly, with the exception of the plural traversaly extending skirt portions, may then be encapsulated with a suitable non-conductive material.

This flat coupling capacitor adapted for mounting directly under a pin grid array package results in a lower decoupling loop, thus providing a more effective decoupling scheme. The capacitor of U.S. Pat. No. 4,853,826 also contributes to a saving of board space, i.e., takes up less "real estate" on the printed circuit board, by resting entirely under the PGA package.

With integrated circuits having a high number of gates per unit area of Silicon or Gallium Arsenide and having high clock rates with small signal rise times an improved decoupling schemes is required. With the higher clock frequencies the existing decoupling capacitors have not been effective in suppressing the noise coupled into the power leads. The above-identified capacitors have attempted to minimize the decoupling loop inductance which is what ultimately limits the highest frequencies effectively decoupled by the capacitor. However, the highest noise frequency that is decoupled by the present capacitors is not the only source of noise coupled into the power leads from the IC. The prior art capacitors only filter out the highest frequency due to self inductance of the capacitor and most importantly the fact that they are elements having only one resonant frequency.

While the prior art capacitors are well suited for their intended purpose a need exists to prevent coupling of noise from the other frequencies.

SUMMARY OF THE INVENTION

The above-discussed and other problems and deficiencies of the prior art are overcome or alleviated by the novel decoupling capacitor of the present invention. In accordance with the present invention, a plurality of capacitive elements each having a different resonance frequency one of which corresponds to the highest noise frequency (i.e., the IC clock frequency) and the others of which correspond to lower harmonics of the highest frequency. The capacitive elements are arranged to form a single component which may be mounted in an open area under a integrated circuit package.

The present invention decouples noise frequencies from the IC to the power leads over a wide bandwidth, thus providing more effective decoupling (i.e., noise suppression). The present invention allows integrated circuits to operate at higher clock speeds without coupling that frequency or harmonics thereof into the power leads.

The above-discussed and other features and advantages of the present invention will be appreciated and understood by those of ordinary skill in the art from the following detailed description of the drawings.

BRIEF DESCRIPTION OF THE DRAWINGS

Referring now to the drawings, wherein like elements are numbered alike in the several FIGURES.

DESCRIPTION OF THE PREFERRRED EMBODIMENT

Figure 1A:
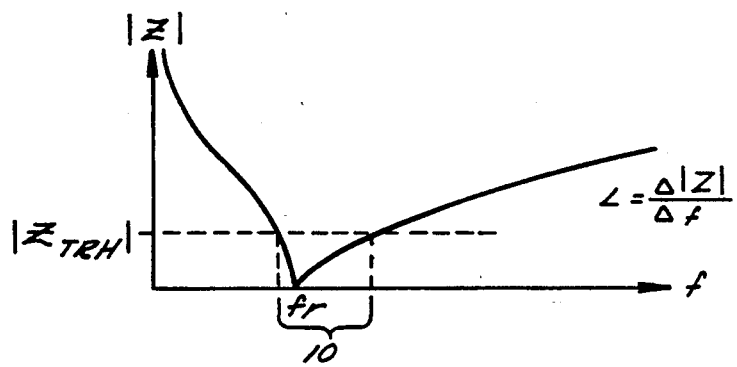
FIG. 1A is a chart illustrating impedance as a function of frequency for a prior art capacitor.
Figure 1B:
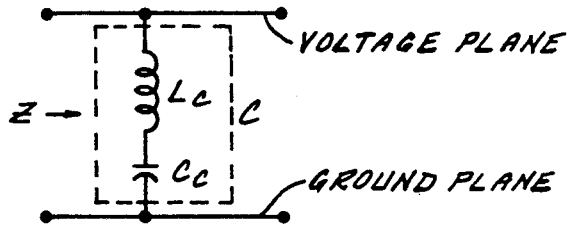
FIG. 1B is an equivalent schematic diagram of the prior art capacitor of FIG. 1A.

Referring now to FIGS. 1A and 1B, both herein labeled prior art, the impedance versus frequency characteristic of a prior art single element capacitor (C) is shown in FIG. 1A and an equivalent schematic diagram of the prior art capacitor is shown in FIG. 1B. It is well known in the art that capacitors have a known amount of self inductance and as a result of which each has a resonant frequency. This is illustrated in FIG. 1B where (Z) is the input impedance of capacitor C, $C_c$ is the capacitance of C and $L_c$ is the self inductance of capacitor C. Capacitor C is connected between the voltage and ground planes of a circuit board which are also connected to an IC that capacitor C is intended to decouple. At low frequencies the capacitor has a very high impedance indicative of an open circuit. At the resonant frequency (fr) of capacitor C the impedance is very low which is characteristic of a short circuit. Ideally, at high frequencies capacitor C has the impedance characteristics of an inductor. Therefore, a narrow bandwidth 10 about the resonant frequency fr of capacitor C is the frequency range at which the impedance of capacitor C is sufficiently low to provide noise suppression when capacitor C is employed as a decoupling capacitor.

Figure 2:
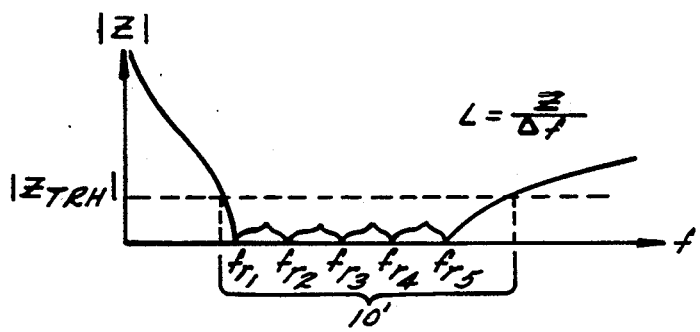
FIG. 2 is a chart illustrating impedance as a function of frequency for a multiple resonant frequency decoupling capacitor in accordance with the present invention.

In accordance with a preferred embodiment of the present invention, referring now to FIG. 2, the impedance as a function of frequency characteristic for a multi-capacitive element is shown. Each element having a different resonant frequency ($fr_1$, $fr_2$ $fr_3$, $fr_4$ and $fr_5$) such that the impedance across the frequency band 10' is continuously below a threshold impedance level. This will provide noise suppression throughout the defined frequency band 10' which is much greater than the frequency range 10 (FIG. 1A) of the prior art single element capacitors.

Figure 3:
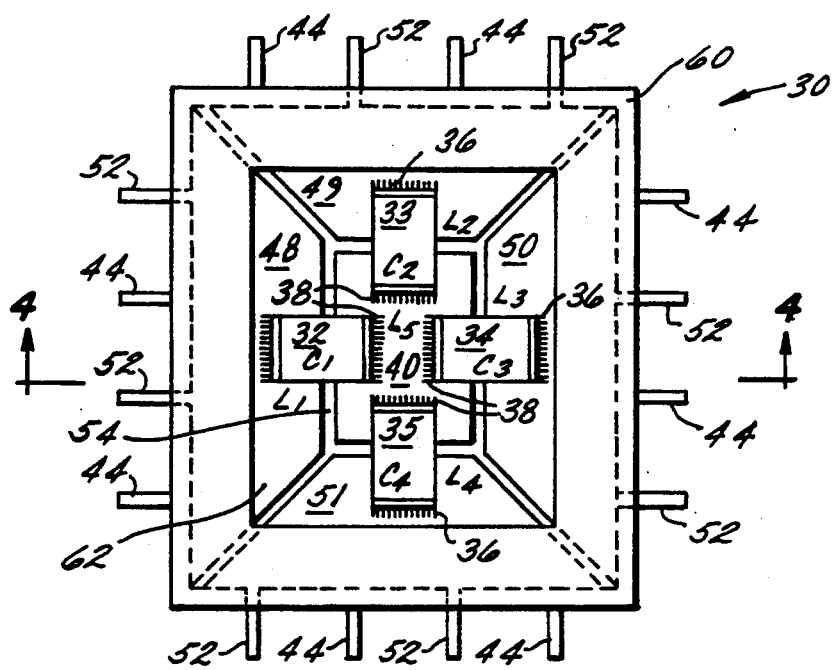
FIG. 3 is a top view of the capacitor of FIG. 2.
Figure 4:
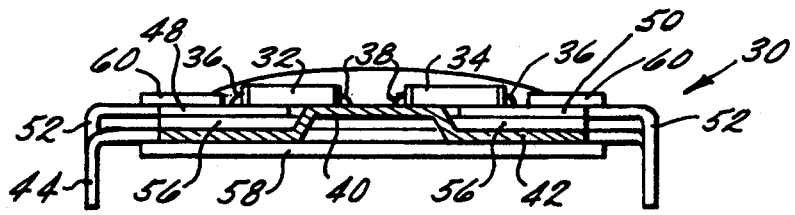
FIG. 4 is a view taken along the line 4—4 in FIG. 3.
Figure 5:
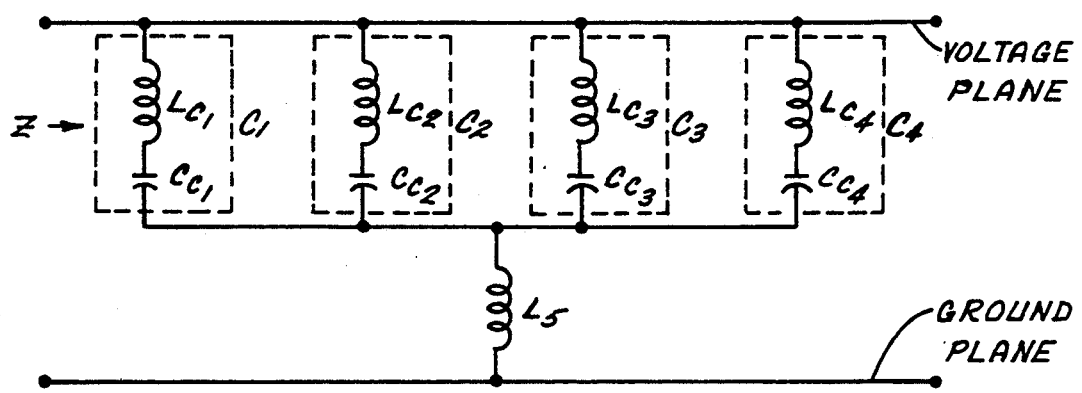
FIG. 5 is an equivalent schematic diagram of the capacitor of FIG. 2.

Referring now to FIGS. 3 and 4, this multi-capacitive element is shown generally at 30. The two port decoupling decapacitor 30 comprises four capacitive elements $C_1$–$C_4$ each having a different resonant frequency $fr_1$–$fr_5$. Each capacitive element $C_1$–$C_4$ has a corresponding capacitance $C_c$ and self inductance $L_c$. It will be appreciated that each resonant frequency $fr_1$–$fr_5$ is selected to provide a continuous frequency range of low impedance (i.e., below $Z_{TRH}$). Schematically capacitor 30 can be illustrated as shown in FIG. 5, wherein $L_{c1}$ (i.e., self inductance of capacitor $C_1$) in series with $C_{c1}$ (i.e., capacitance of $C_1$) defines a first resonant circuit indicative of a first capacitive element $C_1$ 32 of decoupling capacitor 30.

Capacitor 30 has four multi-layer ceramic capacitors 32–35 each having a plurality of leads 36 and 38. Each multi-layer ceramic capacitor comprises multiple layers of metal conductors having a dielectric element sandwiched therebetween and at least one lead extending from each conductor. Leads 38 from each capacitor 32–35 are connected to a raised land 40 of a metal conductor 42. Raised land 40 is located at about the center of metal conductor 42. Further, at least one flat member or lead 44 is extended outwardly and downwardly from each side of conductor 42. Leads 36 from each capacitor 32–35 are connected to a second conductor 46 which has four sections 48–51, one corresponding to each capacitor 32–35. Each of these sections 48–51, one corresponding to each capacitor 32–35. Each of these sections 48–51 are isolated from the other and each section having at least one flat member or lead 52 extending outwardly and downwardly therefrom. Conductor 46 has an aperture 54 at about the center thereof sufficient in size to allow raised land 40 to extend therethrough. Conductors 42 and 46 have an insulated layer 56 disposed therebetween, which also has an aperture corresponding to aperture 54 of conductor 46 in which raised land 40 extends through. A bottom insulating 58 layer is disposed on one surface of conductor 42 and a top insulating layer 60 is disposed on one surface of conductor 46. Insulating layer 60 has an aperture 62 at about the center thereof which corresponds to aperture 54 of conductor 46. However, aperture 62 is larger than the aperture 54 so as to allow a portion of each conductive section 48–51 to be exposed for connection of leads 36 from each capacitor 32–35 to each corresponding conductor 48–51. Capacitors 32–35, the exposed areas of conductors 48–51 and raised land 40 of conductor 42 may be coated with an epoxy. It will be appreciated that inductance is added by the conductors 44,46 and the leads 44, 52 of decoupling capacitor 30. Each inductance $L_{c1}$–$L_{c4}$ (FIG. 5) includes the self inductance of each corresponding capacitor $C_1$–$C_4$, the inductance of the corresponding conductor sections 48–51 (ie, $L_1$–$L_4$, FIG. 3) and the inductance of the corresponding leads 52. Inductance $L_5$ includes the inductance of conductor 44 and the inductance of leads 44.

Leads 52 from conductors 48–51 correspond electrically to lead 36 of each corresponding capacitor 32–35. Leads 44 from conductor 42 correspond to leads 38 of each capacitor 32–35. Leads 38 of capacitors 32–35 are interconnected through raised land 40 of conductor 44. Leads 36 of capacitors 32–35 are not interconnected (ie, leads 36 of each capacitors 32–35 are isolated from the other) in decoupling capacitor 30. However, when decoupling capacitor 30 is connected to the power planes on a circuit board (not shown), leads 36 of each capacitor 32–35 will be interconnected by the voltage plane (FIG. 5). This results in connecting capacitors 32–35 ($C_1$–$C_4$) in parallel and thereby adding the capacitance of each (ie, the sum $C_1$–$C_4$ is the capacitance of decoupling capacitor 30). Further, leads 38 are connected to the ground plane on the circuit board to complete the circuit.

Each conductor 44, 46 and each insulating layer 56, 58, 60 may be laminated together or bonded with a known adhesive. Raised land 40 of conductor 42 may be created by stamping or drawing that portion from conductor 42. Insulating layers 56, 58 and 60 may comprise a ceramic material or other electrically non-conductive materials may suffice.

If decoupling capacitor 30 is to be located in an opening between an IC and a circuit board the physical size of capacitor 30 is somewhat restricted.

Figure 6:
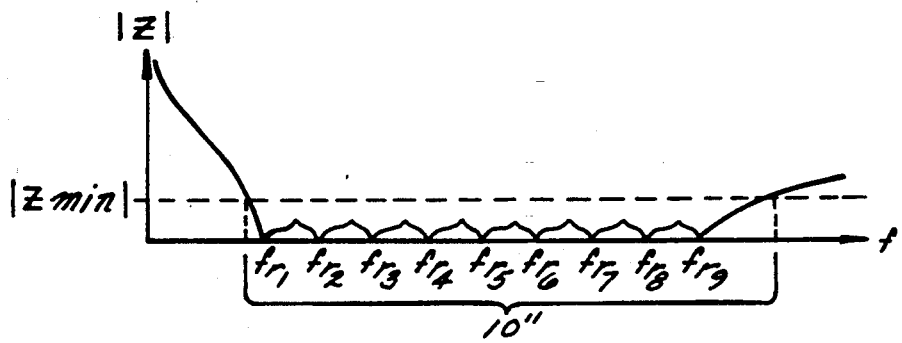
FIG. 6 is a chart illustrating impedance as a function of frequency for a multiple resonant frequency decoupling capacitor having an increased bandwidth in accordance with the present invention.
Figure 7:
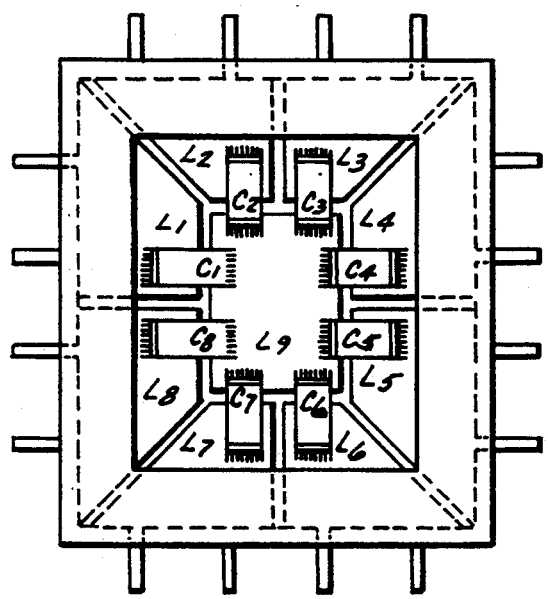
FIG. 7 is a top view of the capacitor of FIG. 6.
Figure 8:
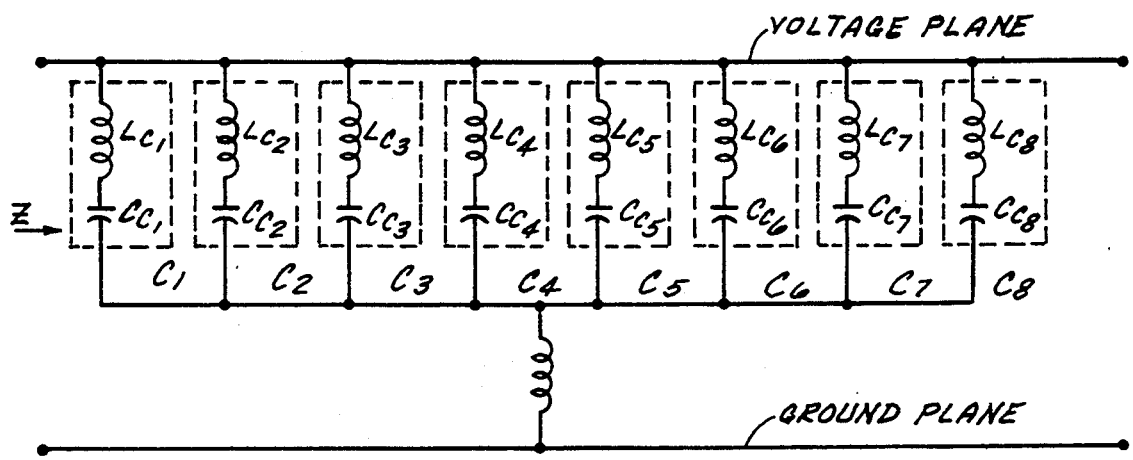
FIG. 8 is an equivalent schematic diagram of the capacitor of FIG. 6.

It will be appreciated that adding additional resonant circuits (ie, capacitive elements) expands the bandwidth of decoupling capacitor 30. Referring now to FIGS. 6–8 decoupling capacitor 30' is shown having eight capacitive elements $C_1$–$C_8$ and each having a different resonant frequency $fr_1$–$fr_8$. The bandwidth 10 of noise suppression is significantly greater than bandwidth 10' (FIG. 2) of decoupling capacitor 30 (FIG. 3). The operation and structure of decoupling capacitor 30' is generally the same as decoupling capacitor 30 in the preferred emodiment and reference is to be made thereto for a description thereof.

Although multi-layer ceramic capacitors have been described other types of capacitors (e.g., single layer capacitors) may be employed for the capacitive elements without departing from the sprit or scope of the present invention. Further, any number of capacitive elements (in excess of one) may be employed to form the decoupling capacitor 30. Moreover, the number of capacitive elements is determined by the desired bandwidth of noise suppression.

Leads 44 and 52 are shown in FIGS. 3,4 and 7 for use with plated throughholes of a circuit board. However, other lead configurations for surface mount pads of a circuit board (e.g., gull wing leads, "J" leads or butt leads) may be employed. The lead configuration employed is dependent on the circuit board and not of functional significance.

The resonant frequency of one section of decoupling capacitor 30 is selected to coincide with the clock frequency of the IC that capacitor 30 is decoupling. The other sections (i.e., capacitive elements) of capacitor 30 are selected to have resonant frequencies that coincide with the lower order harmonics of the IC clock frequency. Spectral frequency analysis of IC switching noise indicates that noise energy is associated with the lower harmonics of the IC clock frequency.

Figure 9:
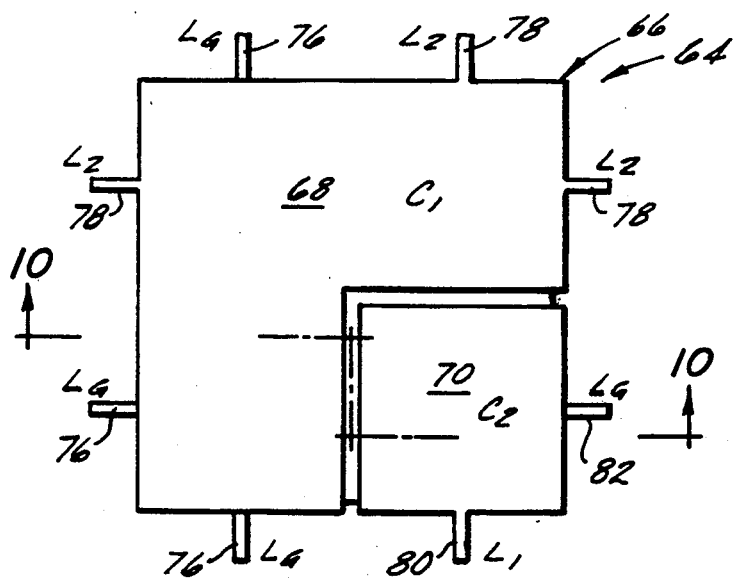
FIG. 9 is a top view of a multiple resonant frequency decoupling capacitor in accordance with an alternate embodiment of the present invention.
Figure 10:
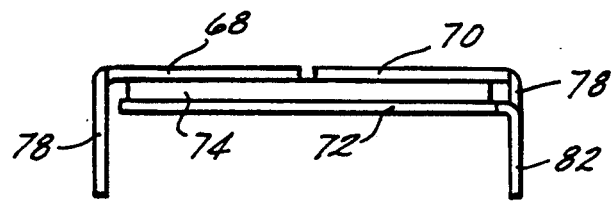
FIG. 10 is a view taken along the line 10—10 in FIG. 9.

Referring now to FIGS. 9 and 10 in an alternate embodiment of the present invention, single layer ceramic capacitors are employed. A decoupling capacitor 64 comprises a first conductor 66 having sections 68 and 70, a second conductor 72, and a layer of dielectric material or a ceramic chip 74 being sandwiched therebetween.

The first capacitive element $C_1$ comprises conductor 68, dielectric material 74, conductor 72, a plurality of ground leads 76 and a plurality of voltage leads 78. The second capacitive element $C_2$ comprises conductor 70, dielectric material 74, conductor 72, a voltage lead 80 and a ground lead 82.

Figure 11:
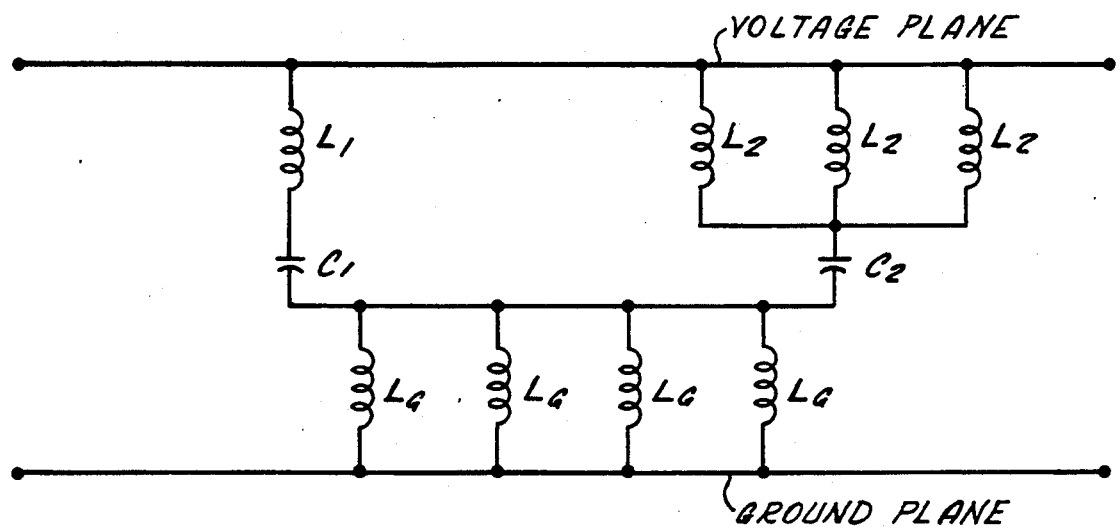
FIG. 11 is an equivalent schematic diagram of the capacitor of FIG. 9.
Figure 12:
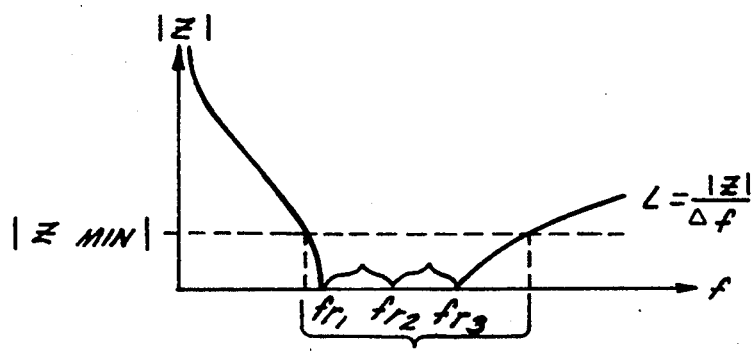
FIG. 12 is a chart illustrating impedance as a function of frequency for the capacitor of FIG. 9.

Schematically decoupling capacitor 64 is shown in FIG. 11. Each capacitive element $C_1$ and $C_2$ has corresponding capacitance and self inductance. Further, the conductors 66, 72 and the leads 76, 78, 80, 82 also provide inductance to the circuit. This results in resonant frequencies $fr_1$-$fr_3$ which defines a bandwidth 84 (FIG. 12) of noise suppression.

Figure 13:
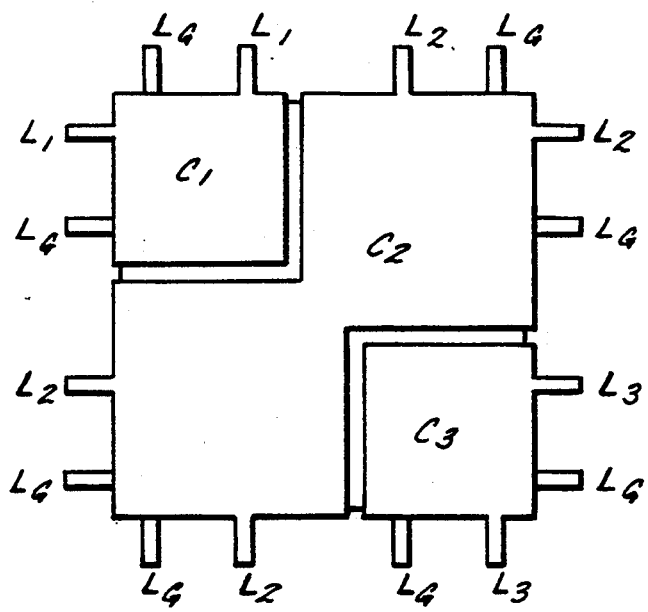
FIG. 13 is a top view of a multiple resonant frequency decoupling capacitor in accordance with another embodiment of the present invention.
Figure 14:
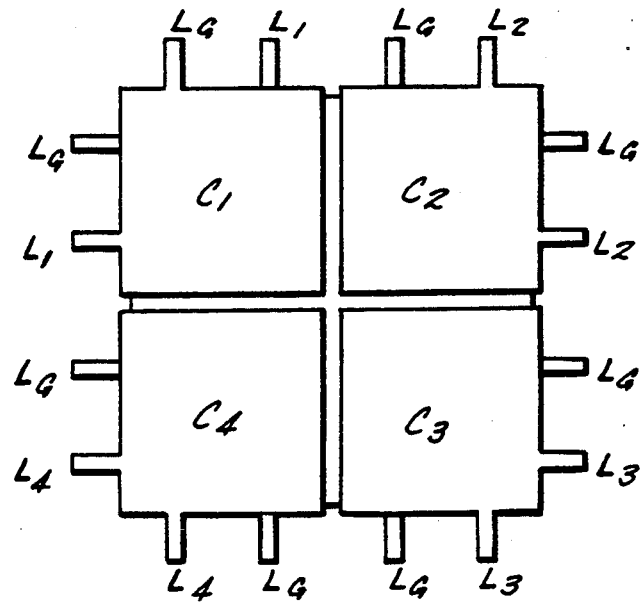
FIG. 14 is a top view of a multiple resonant frequency decoupling capacitor in accordance with still another embodiment of the present invention.

Although dielective material layer 74 is described as a single common layer for both capacitive regions $C_1$ and $C_2$, the layer 74 may be divided into separate sections each corresponding to sections 68 and 70 of conductor 66. The surface area of the separate sections defining the capacitive regions can be varied to determine the capacitance and thereby the resonant frequency of each capacitive region. Alternatively, the surface area of each separate section may be the same and the dielectric material corresponding to each section may be varied to determine the capacitance and resonant frequency for each capacitive region. It will be appreciated that both surface area of the separate sections and dielectric material may be varied to determine the capacitance and resonant frequency. Other partitionings of capacitive elements are shown in FIGS. 13 and 14. It will be appreciated that the number of sections will be determined by the desired bandwidth of noise suppression for the IC being decoupled.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A capacitor comprising:
   a first mutli-sided conductor having a raised land at about a center thereof;
   a second multi-sided conductor having a plurality of separate conductive sections and an aperture at about a center thereof for accepting said raised land;
   a layer of electrically non-conductive material is disposed between said first and second conductor, said layer having an aperture at about a center thereof for accepting said raised land;
   a plurality of capacitive elements each being connected from a corresponding one of said separate conductive sections to said raised land, each of said capacitive elements having a different resonant frequency;
   a first plurality of leads extending outwardly and downwardly from said second multi-sided conductor, at least one of said first leads extending from each of said separate conductive sections; and
   a second plurality of leads extending outwardly and downwardly from said first multi-sided conductor, at least one of said second leads corresponding to each of said separate conductive sections.

2. The capacitor of claim 1 further comprising:
   a first electrically insulating layer disposed at one surface of said second multi-sided conductor, said first electrically insulating layer having an aperture at about a center thereof for accepting said capacitive elements and said raised land; and
   a second electrically insulating layer disposed at one surface of said first multi-sided conductor.

3. The capacitor of claim 1 wherein:
   said capacitor elements each comprise a multi-layer ceramic capacitor.

4. The capacitor of claim 1 wherein:
   said plurality of separate conductive sections comprises four separate conductive sections.

5. The capacitor of claim 1 wherein:
   said plurality of separate conductive sections comprises eight separate conductive sections.

6. The capacitor of claim 1 wherein:
   said first and second conductors each having a rectangular shape with two leads extending from opposed sides of each conductor.

7. The capacitor of claim 1 wherein:
   said resonant frequencies having a first frequency corresponding to a clock frequency of an integrated circuit to be decoupled; and
   said resonant frequencies having at least one other frequency corresponding to a lower harmonic frequency of said first frequency.

8. A decoupling capacitor for use with an integrated circuit package, the integrated circuit package having an array of pins extending from at least one side thereof and surrounding a central pin free area of a predetermined size, at least some of the pins surrounding the central pin free area being first and second voltage level pins, the capacitor comprising:
   a first mutli-sided conductor having a raised land at about a center thereof, said first conductor for defining a first voltage level conductor;
   a second multi-sided conductor having a plurality of separate conductive sections and an aperture at about a center thereof for accepting said raised land, said second conductor for defining a second voltage level conductor;

a layer of electrically non-conductive material is disposed between said first and second conductor, said layer having an aperture at about a center thereof for accepting said raised land;

a plurality of capacitive elements each being connected from a corresponding one of said separate conductive sections to said raised land, each of said capacitive elements having a different resonant frequency;

a first plurality of leads extending outwardly and downwardly from said second multi-sided conductor, at least one of said first leads extending from each of said separate conductive sections;

a second plurality of leads extending outwardly and downwardly from said first multi-sided conductor, at least one of said second leads corresponding to each of said separate conductive sections;

whereby said first and second leads correspond to first and second voltage levels of pins of an integrated circuit package; and said capacitive element, first conductor and second conductor defining an assembly, the size of said assembly being less than the size of the central pin free area.

9. The capacitor of claim 8 further including:

a first insulating layer disposed at one surface of said second multi-sided conductor, said first insulating layer having an aperture at about a center thereof for accepting said capacitive elements and said raised land; and a second insulating larger disposed at one surface of said first multi-sided conductor.

10. The capacitor of claim 8 wherein:

said capacitive elements each comprise a multi-layer ceramic capacitor.

11. The capacitor of claim 8 wherein:

said plurality of separate conductive sections comprises four separate conductive sections.

12. The capacitor of claim 8 wherein:

said plurality of separate conductive sections comprises eight separate conductive sections.

13. The capacitor of claim 8 wherein:

said first and second conductors each having a rectangular shape with two leads extending from opposed sides of each conductor.

14. The capacitor of claim 8 wherein:

said resonant frequencies having a first frequency corresponding to a clock frequency of an integrated circuit to be decoupled; and said resonant frequencies having at least on other frequency corresponding to a lower harmonic frequency of said first frequency.

* * * * *